United States Patent [19]

Nakamura

[11] Patent Number: 5,196,288
[45] Date of Patent: Mar. 23, 1993

[54] IMAGE FORMING METHOD OF EXPOSING AND HEATING LIGHT-SENSITIVE MATERIAL COMPRISING LIGHT-SENSITIVE LAYER PROVIDED ON SUPPORT

[75] Inventor: Taku Nakamura, Kanagawa, Japan

[73] Assignees: Fuji Photo Film Co., Ltd., Kanagawa; Seiko Epson Corp.; Seiko Instruments, Inc., both of Tokyo, all of Japan

[21] Appl. No.: 756,655

[22] Filed: Sep. 9, 1991

[30] Foreign Application Priority Data

Sep. 10, 1990 [JP] Japan .................. 2-239464

[51] Int. Cl.⁵ .................................. G03C 1/72
[52] U.S. Cl. ..................... 430/138; 430/203; 430/253; 430/254; 430/278; 430/281; 430/350; 430/353; 430/526; 430/531
[58] Field of Search ............. 430/138, 281, 278, 271, 430/203, 254, 253, 353, 350, 617, 526, 531, 523, 964

[56] References Cited

U.S. PATENT DOCUMENTS 4,910,117 3/1990 Dowler et al. ............ 430/138
4,939,064 7/1990 Nakamura ................ 430/138
5,073,472 12/1991 Yamamoto ............... 430/138

FOREIGN PATENT DOCUMENTS 1-140140 6/1989 Japan ..................... 430/138

Primary Examiner—Marion E. McCamish
Assistant Examiner—Janis L. Dote
Attorney, Agent, or Firm—Sughrue, Mion, Zinn, Macpeak & Seas

[57] ABSTRACT

An image forming method of imagewise exposing and heating a light-sensitive material is disclosed. The light-sensitive material comprises a support and a light-sensitive layer provided thereon. The light-sensitive layer contains silver halide, a reducing agent, an ethylenically unsaturated polymerizable compound, a color image forming substance and a base precursor. The silver halide, the reducing agent, the polymerizable compound, the color image forming substance and the base precursor are contained in microcapsules which are dispersed in the light-sensitive layer. According to the present invention, the support is made of a thin polymer film having a thickness of not more than 75 μm. The light-sensitive material is heated from the side of the support for 0.1 to 5 seconds.

13 Claims, 1 Drawing Sheet

IMAGE FORMING METHOD OF EXPOSING AND HEATING LIGHT-SENSITIVE MATERIAL COMPRISING LIGHT-SENSITIVE LAYER PROVIDED ON SUPPORT

FIELD OF THE INVENTION

The present invention relates to an image forming method of exposing and heating a light-sensitive material comprising a support and a light-sensitive layer provided thereon.

BACKGROUND OF THE INVENTION

U.S. Pat. No. 4,912,011 discloses a light-sensitive material comprising a support and a light-sensitive layer provided thereon which contains silver halide, a reducing agent, a polymerizable compound and a color image forming substance. The silver halide, the reducing agent, the polymerizable compound and the color image forming substance are contained in microcapsules (light-sensitive microcapsules) which are dispersed in the light-sensitive layer. The U.S. Patent corresponds to Japanese Patent Provisional Publications No. 61(1986)-275742 and No. 61(1986)-278849 and European Patent Provisional Publication No. 0203613A.

An image forming method using the light-sensitive material is also disclosed in U.S. Pat. No. 4,912,011. The method comprises the steps of imagewise exposing the light-sensitive material, and heating the light-sensitive material. A latent image of the silver halide is formed by the exposure. The polymerizable compound is polymerized by heating within the area where the latent image has been formed. The light-sensitive material is then pressed on an image-receiving material to transfer the unpolymerized polymerizable compound with a color image forming substance to the image-receiving material to form a color image on the image-receiving material.

Further, a method of polymerizing the polymerizable compound within the area where the latent image of the silver halide has not been formed is disclosed in Japanese Patent Provisional Publications No. 61(1986)-243449, No. (1986)-260241, No. 2(1990)-141756 and No. 2(1990)-141757. The contents of the former two publications are described in European Patent Provisional Publication No. 0202490A.

The heating time for the development and polymerization reactions was usually from 1 second to 5 minutes, and preferably from 5 seconds to 1 minutes, as is described at column 23, lines 24-26 in U.S. Pat. No. 4,912,011. Various heating means are disclosed at column 22, line 24 to column 23, line 13 in U.S. Pat. No. 4,912,011. The light-sensitive material can be heated from the side of the support or from the side of the light-sensitive layer (cf., column 23, lines 10-13 in U.S. Pat. No. 4,912,011).

By the way, an image recording apparatus for the above-described image forming method has recently been proposed (cf., U.S. Pat. Nos. 4,737,822, No. 4,783,683, No. 4,797,710, No. 4,819,032 and No. 4,825,041). The size of the apparatus is proportional to the heating time as well as the size of the light-sensitive material. Accordingly, the heating time for the development and polymerization reactions should be shortened to construct a compact apparatus.

Further, the light-sensitive material used in the apparatus is preferably in the form of roll film. The roll of the light-sensitive material is continuously imagewise exposed to light, heated and pressed on an image-receiving material. In this case, the length of the light-sensitive material necessary for formation of one image is determined by the time of the longest process, namely the heating process. Accordingly, it is necessary for saving the roll of the light-sensitive material to shorten the heating time.

There are two ways to shorten the heating time. One way is to improve the light-sensitive material. The other is to improve the heating means.

The development and polymerization reactions smoothly proceed in alkaline conditions. Therefore, the light-sensitive material preferably contains a base precursor as an image formation accelerator to shorten the heating time. In order to more accelerate the development and polymerization reactions, it is preferred to incorporate the base precursor into light-sensitive microcapsules, as is described in U.S. Pat. No. 4,939,064 (corresponding to Japanese Patent Provisional Publication No. 64(1989)-32251 and European Patent Provisional Publication No. 0301539A) and Japanese Patent Provisional Publications No. 1(1989)-263641, No. 2(1990)-14601 and No. 3(1991)-25444. The base precursor is composed of a salt of an organic base with a carboxylic acid, and is generally used in the form of solid particles.

With respect to the heating means, the efficiency of heat conduction has mainly been considered. Accordingly, the light-sensitive material has been directly heated from the side of the light-sensitive layer in the case that the heating time should be shortened.

SUMMARY OF THE INVENTION

The applicant has studied the above-mentioned image forming method to further shorten the heating time for the development and polymerization reactions.

The applicant has first tried elevating the heating temperature. However, the image quickly formed at a high temperature is not clear enough. Particularly, the contrast of the formed image is low. Therefore, it is concluded that the high heating temperature is not so effective in shortening the heating time as expected.

Now, the applicant surprisingly finds that the heating time can be shortened in the case that the light-sensitive material is heated from the side of the support under specific conditions.

An object of the present invention is to provide a method of quickly forming a clear image which has a high contrast (a high maximum density and a low minimum density).

Another object of the invention is to provide an image forming method which can be conducted in a compact image recording apparatus.

A further object of the invention is to provide an image forming method which saves the roll of the light-sensitive material used in an image recording apparatus.

There is provided by the present invention an image forming method which comprises the steps of:

imagewise exposing to light a light-sensitive material which comprises a support and a light-sensitive layer provided thereon containing silver halide, a reducing agent, an ethylenically unsaturated polymerizable compound, a color image forming substance and a base precursor, wherein the silver halide, the reducing agent, the polymerizable compound, the color image forming substance and the base precursor are contained in microcapsules which are dispersed in the light-sensitive layer, and the support is made of a polymer film having a thickness of not more than 75 μm; and simultaneously or thereafter heating the light-sensitive material from the side of the support for 0.1 to 5 seconds.

According to study of the applicant, it has surprisingly been found that the heating time can be shortened (in the range of 0.1 to 5 seconds) under the following specific conditions:

(1) The silver halide, the reducing agent, the polymerizable compound, the color image forming substance and the base precursor are contained in microcapsules which are dispersed in the light-sensitive layer;

(2) The support is made of a polymer film having a thickness of not more than 75 μm; and (3) The light-sensitive material is heated from the side of the support.

Considering the efficiency of heat conduction, it seems to be natural that the light-sensitive material is preferably heated from the side of the light-sensitive layer to shorten the heating time. Further, oxygen in the air has a function of inhibiting a polymerization reaction. Accordingly, the light-sensitive material was usually heated on a hot plate from the side of the light-sensitive layer to prevent the influence of oxygen.

In practice, however, the method of the present invention quickly forms a clear image having a high contrast though the light-sensitive material is heated from the side of the support. This unexpected result is explained below.

The applicant notes that oxygen in the air gradually influences the polymerization reaction in the light-sensitive layer. The function of oxygen is weak at an initial stage of the heat development. At the initial stage, the function is not so strong as to affect the polymerization reaction within the area to be polymerized. Oxygen only inhibits an incidental polymerization reaction within the area not to be polymerized. Accordingly, oxygen in the air improves the contrast of the image in the case that the heating time is short. Therefore, a clear image having a high contrast can be obtained when the light-sensitive material is heated from the side of the support for a short term (0.1 to 5 seconds). If the light-sensitive material is heated for a relatively long term (10 seconds or more), oxygen uniformly inhibits the polymerization reaction.

The applicant further notes that some of the microcapsules are ruptured when the light-sensitive material is heated from the side of the light-sensitive layer. This is remarkable in the case that the light-sensitive material is heated on a hot plate or the case that the support is made of a polymer film. The ruptured microcapsules much reduces the contrast of the image. When the light-sensitive material is heated from the side of the support according to the present invention, the microcapsules are not ruptured.

For the reasons mentioned above, the method of the present invention quickly forms a clear image which has a high contrast. Further, the method of the invention can be conducted in a compact image recording apparatus. Furthermore, the method can save the roll of the light-sensitive layer used in the image recording apparatus.

DETAILED DESCRIPTION OF THE INVENTION

Figure 1:
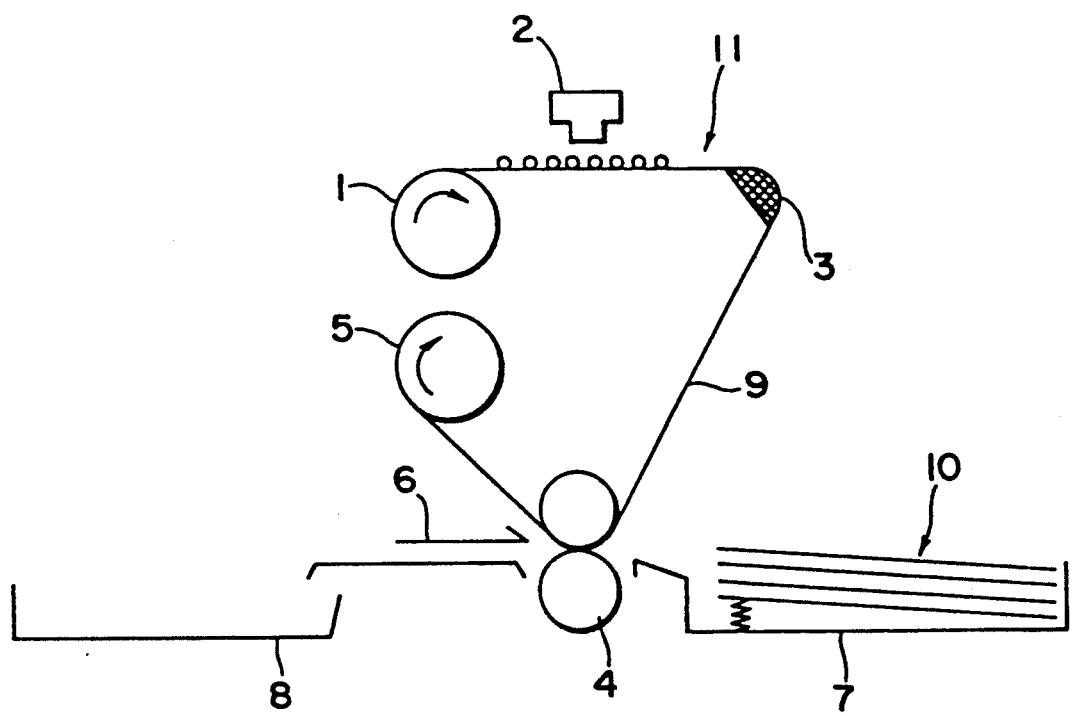
FIG. 1 is a sectional view schematically illustrating an image recording apparatus.

In the present invention, the support of the light-sensitive material is made of a thin polymer film having a thickness of not more than 75 μm. The thickness of the support is determined by considering the heat conduction and the physical strength. The thickness of the support preferably is not more than 50 μm. The support more preferably has a thickness in the range of 10 μm to 50 μm.

Examples of the polymer used for preparation of the support include polyester (e.g., polyethylene terephthalate, polyethylene naphthalenedicarboxylate), polyamide, polyolefin, polyvinyl chloride, polystyrene, polymethacrylate and polycarbonate. Polyester is preferred. The support may be prepared by lamination of two or more polymers.

The support preferably has a low stretching ratio in the range of −5% to +0.5% measured at 120° C. to 180° C. both in the machine direction and in the cross direction. The stretching ratio is measured according to JIS-C-2318.

The polymer film can be prepared by a biaxial stretching process, which comprises stretching in the machine direction, stretching in the cross direction, and thermal fixing or thermal relaxation. For example, the process for preparation of polyethylene terephthalate film is described below.

A polymer sheet extruded from a machine is cooled on a casting drum. The sheet is heated between preheat rolls, and then stretched in the machine direction and cooled. The stretching in the machine direction is caused by the difference in circumferential velocity between two nip rolls. The both ends of the film is clipped on an endless belt. The film is placed in a tenter, preheated, stretched in the cross direction and heated. The stretching temperature is in the range of 80° C. to 150° C., and the heating temperature is in the range of 180° C. to 250° C.

The stretching ratio of the polymer support can be determined by adjusting the conditions of the thermosetting. The conditions of the thermosetting are determined by the relaxation after the stretching process in the cross direction and the heating temperature and time. The conditions are also influenced by the conditions of the stretching process.

The surface of the above-mentioned polymer support may be treated to be reflective to white or hydrophilic. In the case that the light-sensitive layer is hydrophilic, the surface of the support preferably is also hydrophilic to adhere the light-sensitive layer.

There are three way to forming a hydrophilic surface on the polymer support. One way is to chemically or physically treat the surface of the support to be hydrophilic. Another is to provide an hydrophilic undercoating layer on the support. After the surface of the support is treated to be hydrophilic, the undercoating layer may be provided on the support. The other is to evaporate a metal film onto the support. It is particularly preferred that an aluminum film is evaporated onto the polymer support.

Next, the steps of the image forming method are described below.

Various exposure means can be employed in the imagewise exposure, and in general, the light-sensitive material is imagewise exposed to a radiation to obtain a latent image of the silver halide. The kind of light source or the amount of light employed in the exposure can be selected depending on a light-sensitive wavelength (or intensified wavelength in the case of spectral sensitization) of the silver halide and a sensitivity of the light-sensitive material.

The examples of the radiation include natural light, ultraviolet light, visible light and infrared light. A high energy radiation such as X-ray, γ-ray and electron beam is also available. However, the light source does not need to be high energy. Examples of the light source include a fluorescent lamp, a tungsten lamp, a halogen lamp, a xenon flash lamp, various lasers (e.g., a gas laser, a solid laser, a chemical laser and a semiconductor laser), a light emission diode, a plasma emitting tube and FOT.

In the case that a full color image is formed, the light-sensitive material contains two or more microcapsules which are different from each other with respect to the spectral sensitivity. Accordingly, the light-sensitive material is exposed to two or more spectral lights to form a full color image. In this case, a light source emitting two or more lights is available. Further, a combination of two or more monochromatic light sources is also available.

The light source should be selected in consideration of the light-sensitive wavelength as is mentioned above. Further, it is preferably considered whether the image information is an electrical signal or not (digital or analog). The processing speed of the system, the size of the image recording apparatus and the electric power of the apparatus are also important factors of the light source.

In the case that the image information is not an electrical signal, a subject such as a landscape, a portrait is directly photographed, an original image is directly copied, or a positive such as a reversal film is exposed to light. In this case exposure devices for a camera, a printer, an enlarging apparatus and a copying machine are available. A two-dimensional image can be exposed to light by one shot using these exposure device. Further, the image can also be scanned through a slit. An original image can be enlarged or reduced. In this case, a fluorescent lamp or a tungsten lamp is a preferred light source. However, a monochromatic light such as a laser is also available where two ore more light are used in combination.

In the case that the image information is an electrical signal, two or more monochromatic lights such as a light emission diode or a laser can be used in combination as a light source. The combination is determined in consideration of the spectral sensitivity of the light-sensitive material. Further, various display devices (CRT, liquid crystal display, electroluminescence display, electrochromic display and plasma display) are also available. In this case, the image information is an image signal such as a obtained by a video camera or an electron still camera, a television signal, a signal obtained by scanning an original image, and a signal stored in a recording material such as a magnetic tape or disk.

In the case of the exposure of a color image, two or more monochromatic lights are used in combination in consideration of the spectral sensitivity of the light-sensitive material. In this case, two or more light sources such as LED, a laser and a fluorescent lamp may be used in combination. The spectral sensitivity of the light-sensitive material usually contains R (Red), G (Green) and B (Blue). Light sources of UV (Ultraviolet) and IR (Infrared) have also recently been available. In addition to the combination of R, G and B, examples of the combination of the spectral sensitivity include (G, R, IR), (R, short wave IR, long wave IR), (short wave UV, medium wave UV, long wave UV) and (UV, B, G). A combination of different light sources such as two kinds of LED and a laser is available. A light emitting tube or element can be used in a scanning exposure with respect to individual colors. Arrays such as a LED array, a liquid crystal shutter array and a magneto-optical element shutter array can be used to increase the speed of the exposure.

The display devices such as CRT include a monochromatic device and a color device. The monochromatic device may form a color image in the case that a filter and a multiple exposure are employed. A conventional two-dimensional display device can be used as a one-dimensional device such as FOT. In the case that the display device and a scanner are used in combination, the displayed image can be divided into two or more parts.

In the method of the present invention, the light-sensitive material is heated from the side of the support for 0.1 to 5 seconds simultaneously with or after imagewise exposure.

Heating in the heat development process can be conducted in various known manners. For example, a heating layer which is arranged on the light-sensitive material can be used as the heating means. Further, the light-sensitive material can be heated on a hot plate, an iron or a heat roller. Furthermore, the material can be heated between a heat roller and a belt.

The whole surface of the light-sensitive material can be heated by a heater which is larger than the light-sensitive material. The light-sensitive material can also be heated by scanning the material with a small heater (e.g., hot plate, heat roller, heat drum).

Further, the light-sensitive material can be heated though the material is not in contact with a heater. For example, the light-sensitive material may be heated with an electromagnetic wave, an infrared ray or a hot air.

In the present invention, the light-sensitive material is heated from the side of the support. The side of the light-sensitive layer is usually open to the air. However, the side of the layer may be covered with an adiabatic material to maintain the heating temperature. In this case, it is necessary to carefully handle the adiabatic material. If the adiabatic material is pressed on the light-sensitive material at a high pressure (10 kg/cm$^2$ or more), the microcapsules contained in the light-sensitive layer tend to be ruptured.

After the light-sensitive material is imagewise exposed to light, the light-sensitive material is heated preferably at an interval of 0.1 second or more. The heating time is in the range of 0.1 to 5 seconds, and preferably in the range of 0.1 to 3 seconds. The heating temperature usually ranges from 60° C. to 260° C., preferably from 80° C. to 180° C. The light-sensitive material is preferably heated on a hot plate from the side of the support. Further, the light-sensitive material is usually heated under conditions substantially not containing water. The term "conditions substantially not containing water" means that the content of water contained in the light-sensitive material is less than 10 weight % based on the total amount of the light-sensitive layer.

In the above-described heat development process, the polymerizable compound is polymerized within the area where a latent image of the silver halide has been formed or the area where a latent image of the silver halide has not been formed. In the case that a polymerization inhibitor is formed by a reaction of a reducing agent within the area where a latent image of silver halide, the polymerizable compound within the area where a latent image of the silver halide has not been formed is polymerized by a thermal polymerization initiator or a photopolymerization initiator. The thermal polymerization initiator or the photopolymerization initiator is preferably contained in the light-sensitive layer, and more preferably contained in the microcapsules. After the heat development process, the light-sensitive material may be heated in the presence of the thermal polymerization initiator, or irradiated with light in the presence of the photopolymerization initiator.

A color image can be obtained on an image-receiving material by pressing the light-sensitive material on the image-receiving material to transfer the unpolymerized polymerizable compound with the color image forming substance to the image-receiving material.

For applying a pressure to the light-sensitive material and the image-receiving material, any known pressing methods can be employed.

For example, the light-sensitive material and the image-receiving material are sandwiched between press plates such as a presser or transferred using a pressure roller such as a nip roll, to apply a pressure to them. A dot-impact device can be also employed to intermittently give a pressure to them. Otherwise, a pressure may be applied to the light-sensitive material and the image-receiving material by spraying a high-pressure air by means of an air gun or using a ultrasonic wave-generating device or a piezoelectric element.

The light-sensitive material and the image-receiving material are preferably pressed at a pressure of not more than 1,200 kg/cm$^2$, more preferably not more than 500 kg/cm$^2$, and most preferably not more than 300 kg/cm$^2$. It is particularly preferred that the materials are pressed while heating. When the materials are heated, an image can be transferred at a very low pressure.

The above-mentioned steps of the method of the present invention are preferably conducted in an image recording apparatus. In this case, the light-sensitive material is preferably in the form of roll film.

The image forming method of the invention can be used for color photography, printing and copy (e.g., computergraphic hard copy and xerox copy). The present invention provides a compact and inexpensive image forming system such as a copying machine and a printer.

The light-sensitive layer of the light-sensitive material used in the present invention is described below.

Examples of the silver halide employable for the light-sensitive material include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron or tetradecahedron, an irregular form such as spherical form or tubular form, a form having crystalline defect such as a twinning plane, and a mixed form thereof.

The silver halide grains may be extremely small sized grains having a grain diameter of not more than 0.01 μm, or may be relatively large sized grains having a grain diameter of projected area up to 10 μm. The silver halide emulsion may be a polydispersed emulsion or a monodispersed emulsion described in U.S. Pat. Nos. 3,574,628 and No. 3,655,394, and U.K. Patent No. 1,413,748.

A tubular grain having an aspect ratio of not less than approx. 5 can be also employed. The tubular silver halide grains can be easily prepared by processes described in Gutoff, "Photographic Science and Engineering, Vol. 14, pp. 248-257 (1970)", U.S. Pat. Nos. 4,434,226, No. 4,414,310, No. 4,433,048 and No. 4,439,520, and U.K. Patent No. 2,112,157.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide. Two or more kinds of silver halide grains which differ in halogen composition, crystal habit, grain size, and/or other features from each other can be employed in combination.

The silver halide photographic emulsions employable in the light-sensitive material of the invention can be prepared by processes described, for example, in "Research Disclosure (RD), No. 17,643, pp. 22-23 (Dec. 1978), (Emulsion preparation and types) and No. 18,716, p. 648.

The silver halide emulsion is generally used after subjecting it to physical ripening, chemical ripening and spectral sensitization. Various additives employable in those stages are described in Research Disclosure, No. 17,643 and No. 18,716. The relevant parts in the literature are described below in the form of a table.

Conventional photographic additives employable in the invention are also described in the above-mentioned Research Disclosure, and the relevant parts in the literature are also shown in the following table.

| Additives | RD 17,643 | RD 18,716 |
| --- | --- | --- |
| Chemical sensitizing agent | p. 23 | p. 648 (right side) |
| Sensitivity-increasing agent | | ditto |
| Spectral sensitizing agent and Supersensitizing agent | p. 23-24 | p. 648 (right side) p. 649 (right side) |
| Anti-fogging agent and Stabilizer | p. 24-25 | p. 649 (right side) |

It is preferred to use silver halide grains having a relatively low fogging value.

For uniformly incorporating the silver halide into microcapsules, a copolymer composed of a hydrophilic repeating unit and a hydrophobic repeating unit is preferably dissolved in the polymerizable compound.

The reducing agent employable in the light-sensitive material of the invention has a function of reducing the silver halide and/or a function of accelerating (or restraining) polymerization of the polymerizable compound. There are known various reducing agents having the above-mentioned functions. Examples of such reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind, amount of the above reducing agent, the polymerizable compound can be polymerized within the area where a latent image of the silver halide has been formed or has not been formed. In a system wherein the polymerizable compound is polymerized within the area where a latent image of the silver halide has not been formed, 1-phenyl-3-pyrazolidones, hydroquinones and sufonamidephenols are particularly preferred as the reducing agent.

Various reducing agents having the above-mentioned functions (including compounds referred to as developing agent, hydrazine derivative) are described in T. James, "The Theory of the Photographic Process", 4th edition, pp. 291–334 (1977), Research Disclosure Vol. 170, No. 17029, pp. 9–15 (June 1978), and Research Disclosure Vol. 176, No. 17643, pp. 22–31 (December 1978). Further, there can be also employed a reducing agent precursor capable of releasing a reducing agent under heating or in contact with a base. Also in the light-sensitive material of the invention, various reducing agents and reducing agent precursors can be effectively employed. Thus, "the reducing agent(s)" in the present specification means to include all of the reducing agents and reducing agent precursors described in the publications.

Among the above-mentioned reducing agents, those having a basic nature, which form a salt, can be used in the form of a salt of an appropriate acid.

The reducing agents can be used singly or in combination. In the case that two or more reducing agents are used in combination, certain interactions between the reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the intersections has occurred in practical use.

Concrete examples of the above-mentioned reducing agents are as follows.

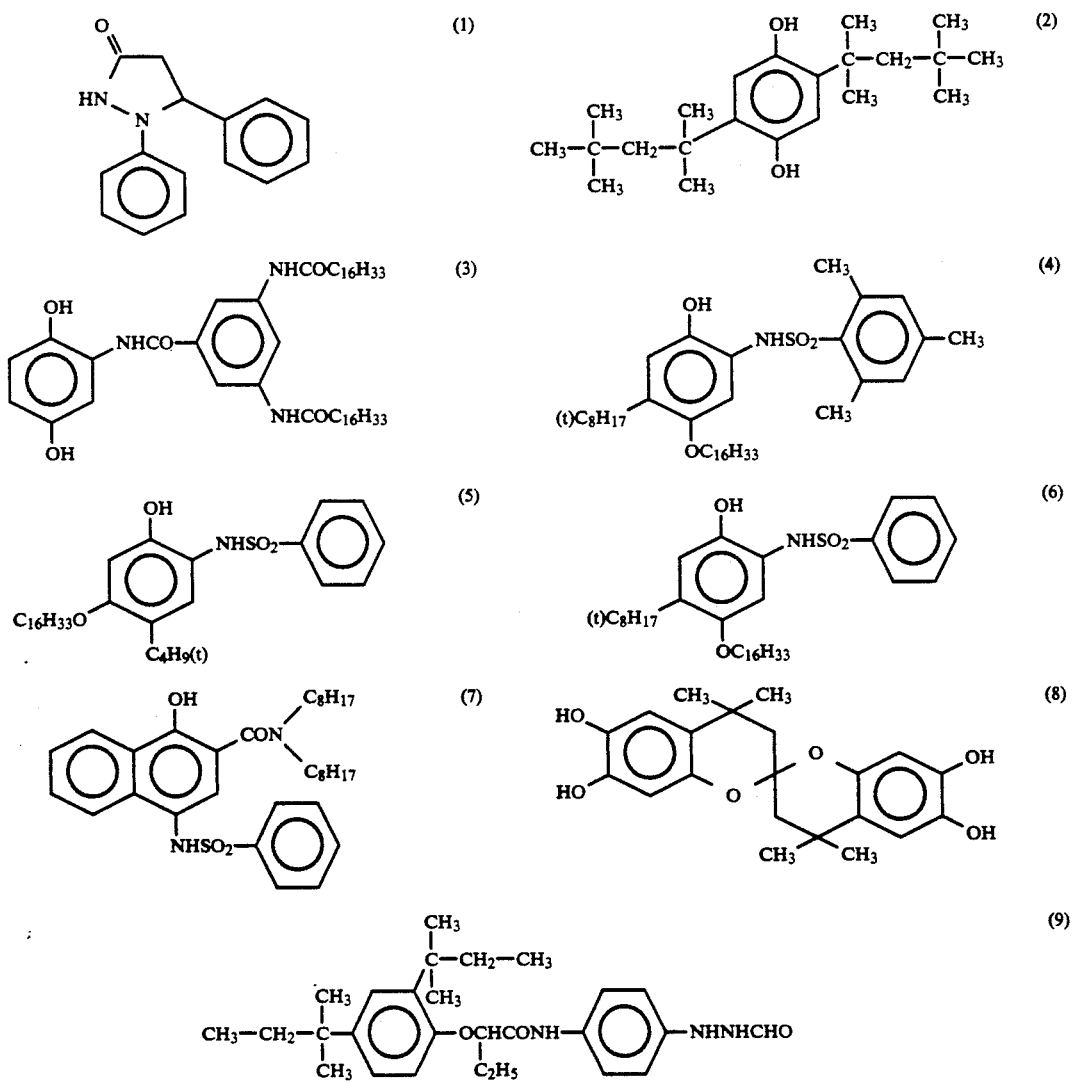

-continued

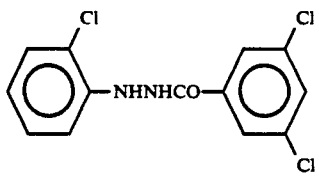 (10)

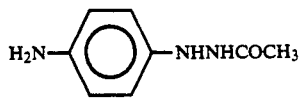 (11)

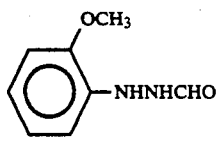 (12)

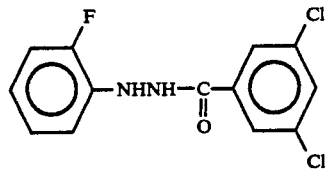 (13)

The reducing agent can be used in the light-sensitive material in an amount of wide range, but generally the amount thereof is in the range of 0.1 to 1,500 mole %, preferably in the range of 10 to 300 mole %, based on the amount of the silver salt.

There is no specific limitation with respect to the color image forming substance, and various kinds of substances are available. Examples of the color image forming substance include colored substance (i.e., dyes and pigments) and non-colored or almost non-colored substance (i.e., color former or dye or pigment-precursor) which develops to give a color by an external energy (e.g., heating, pressing or light irradiation) or by other components (i.e., color developer).

In the present invention, the color image forming substance preferably is a colored substance such as a dye or a pigment. A pigment is particularly preferred.

As the pigment used in the invention, there can be mentioned not only those commercially available but also those described in various literatures such as "Handbook of Color Index (C. I.)", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)".

The pigments can be classified based on the color difference into white pigment, black pigment, yellow pigment, orange pigment, brown pigment, red pigment, violet pigment, blue pigment, green pigment, fluorescent pigment, metallic powder pigment, and polymeric linking dyestuff. Examples of a pigment include insoluble azo pigment, azolake pigment, condensed azo pigment, chelate azo pigment, phthalocyanine pigment, anthraquimone pigment, perylene and perynone pigment, thioindigo pigment, quinacridone pigment, dioxadine pigment, isoindolinone pigment, quinophthalone pigment, color lake pigment, azine pigment, nitroso pigment, nitro pigment, natural pigment, fluorescent pigment and inorganic pigment.

The pigment particles are preferably surface treated to be lipophilic. The methods of surface treatment include a method having the step of coating with a resin or a wax, a method having the step of attaching of a surface active agent or a method having the step of connecting an active substance (e.g., a silane coupling agent, an epoxy compound and polyisocyanate) onto the surface of the pigment. The methods are disclosed in "Nature and Application of Metallic Soap", Saiwai Shobo (ed.); "Printing Ink Technique", CMC. Shuppan (ed. 1984); and "New Application and Technique of Pigment", CMC. Shuppan (ed. 1986).

The diameter of the pigment particles preferably is in the range of 0.01 to 10 μm, more preferably 0.05 to 1 μm in the measurement after the particles are dispersed in the polymerizable compound.

The pigment is preferably used in an amount of 5 to 60 parts by weight, based on 100 parts by weight of the polymerizable compound. The pigment particles can be dispersed in the same manner as in a known dispersing technique such as preparation of ink or toner. Various dispersing devices are available. Examples of the dispersing device include a sand mill, an attritor, a pearl mill, a supermill, a ball mill, an impeller, a disperser, a KD mill, a colloid mill, a dynatron, a three-rolls mill and a pressure kneader. The dispersing devices are described in "New Application and Technique of Pigment", CMC Shuppan (ed. 1986).

The polymerizable compounds used in the light-sensitive material generally are compounds having an ethylenically unsaturated group.

Examples of the compounds having an ethylenic unsaturated group which can be used for the light-sensitive material include acrylic acids, salts of acrylic acids, acrylic esters, acrylamides, methacrylic acid, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxane diacrylate, 2-(2-hydroxy-1,1-dimethylethyl)-5,5-dihydroxymethyl 1,3-dioxane triacrylate, triacrylate of propyleneoxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate and dimethacrylate of polyoxyalkylenated bisphenol A.

The polymerizable compounds can be used singly or in combination of two or more compounds. Further, polymerizable compounds in which a polymerizable functional group such as a vinyl group or a vinylidene group is introduced into a chemical structure of the above-described reducing agent can be also employed as the polymerizable compound.

The base precursor used in the present invention includes various inorganic or organic compounds, and is classified into decarboxylation type, thermal decomposition type, reaction type and complex salt-formation type.

The base precursor preferably is a salt of an organic base and an acid which decarboxylates under heating or a compound which release a base under heating.

The base precursor used in the invention preferably releases a base at a temperature in the range of 50° C. to 200° C., and more preferably 80° C. to 180° C.

The base precursor preferably has a solubility in water of not more than 1% at 25° C. to be incorporated into microcapsules.

A preferred base precursor is composed of a salt of an organic base with a carboxylic acid. The organic base preferably is a diacidic, triacidic or tetraacidic base which composed of two to four amidine or guanidine moieties and at least one residue of a hydrocarbon or a heterocyclic ring as a linking group of the amidine or guanidine moieties.

The amidine moiety corresponds to an atomic group formed by removing one or two hydrogen atoms from the compound having the formula (I).

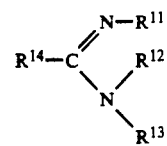

(I)

In the formula (I), each of $R^{11}$, $R^{12}$, $R^{13}$ and $R^{14}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{11}$, $R^{12}$, $R^{13}$ and $R^{14}$ may be combined together to form a five-membered or six-membered nitrogen-containing heterocyclic ring.

The guanidine moiety corresponds to an atomic group formed by removing one or two hydrogen atoms from the compound having the formula (II).

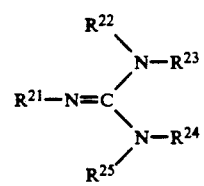

(II)

In the formula (II), each of $R^{21}$, $R^{22}$, $R^{23}$, $R^{24}$ and $R^{25}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{21}$, $R^{22}$, $R^{23}$, $R^{24}$ and $R^{25}$ may be combined together to form a five-membered or six-membered nitrogen-containing heterocyclic ring.

Examples of the base precursor are shown below.

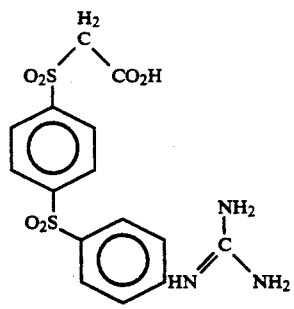

(1)

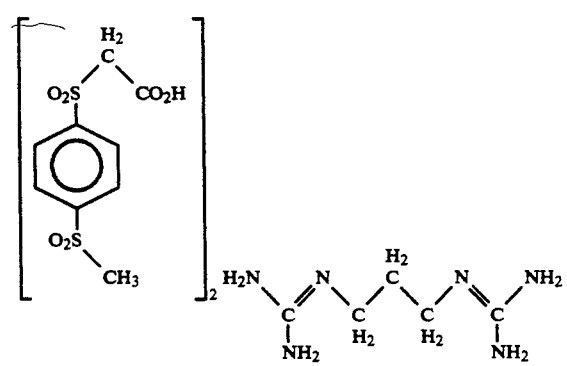

(2)

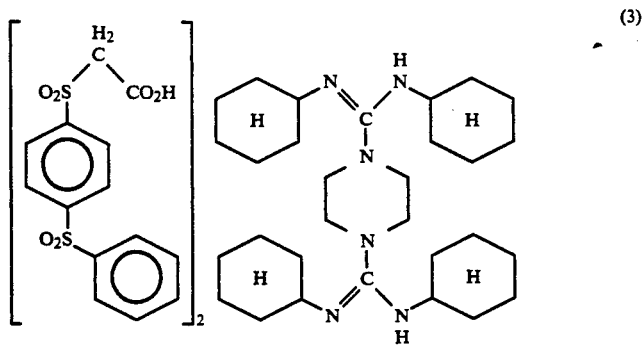
(3)
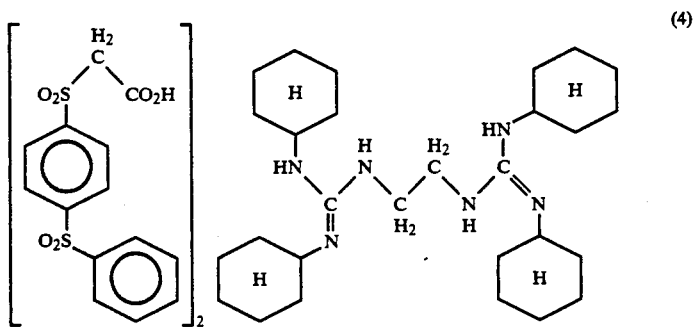
(4)
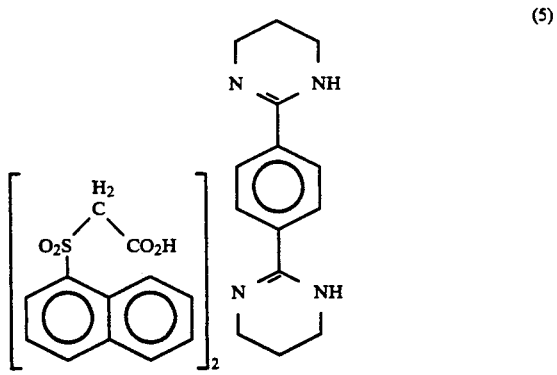
(5)
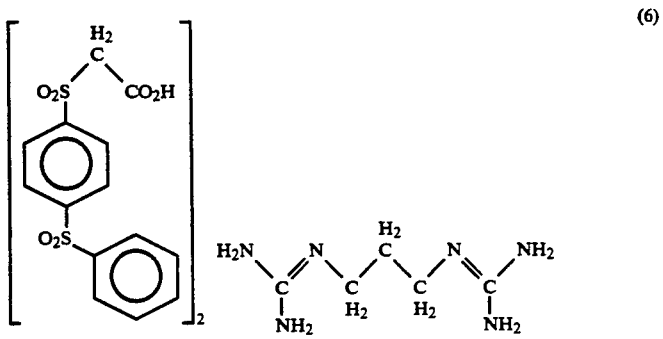
(6)

(7)
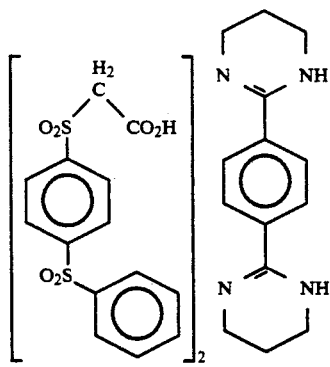
(8)
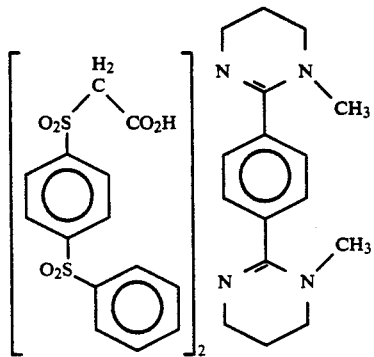
(9)
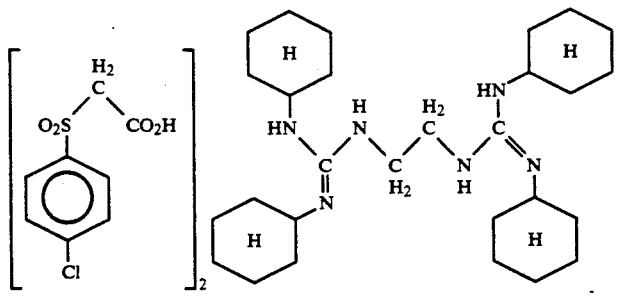
(10)
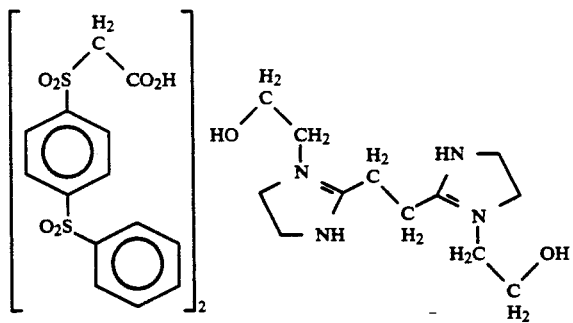
(11)
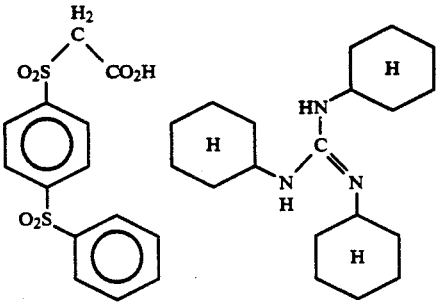

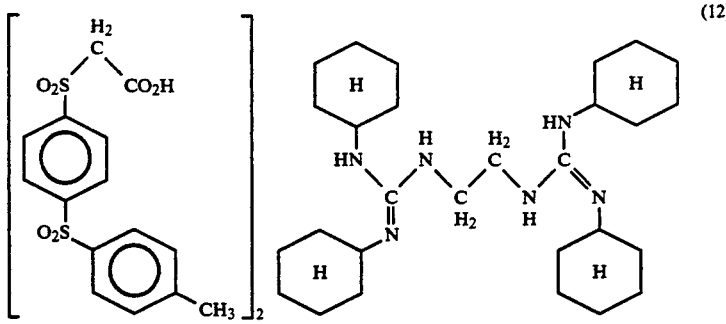

(12)

There is no specific limitation on the preparation of microcapsules, and any known processes can be employed. Examples of the processes for preparing microcapsules include a process utilizing coacervation of hydrophilic wall-forming materials (U.S. Pat. No. 2,800,457 and U.S. Pat. No. 2,800,458); an interfacial polymerization process (U.S. Pat. No. 3,287,154 U.K. Pat. No. 990,443, and Japanese Patent Publications No. 38(1963)-19574, No. 42(1967)-446 and No. 42(1967)-771); a process utilizing precipitation of polymers (U.S. Pat. No. 3,418,250 and U.S. Pat. No. 3,660,304); a process of using isocyanate-polyol wall-materials (U.S. Pat. No. 3,796,669); a process of using isocyanate wall-materials (U.S. Pat. No. 3,914,511); and a process of using amino-aldehyde resins (U.S. Pat. Nos. 4,001,140, No. 4,087,376, No. 4,089,802 and No. 4,025,455, and Japanese Patent Provisional Publications No. 62(1987)-209439, No. 64(1989)-91131 and No. 1(1989)-154140).

Examples of the amino-aldehyde resins include an urea-formaldehyde resin, an urea-formaldehyde-resorcinol resin, a melamine-formaldehyde resin, an acetoguanamine-formaldehyde resin and a benzoguanamine-formaldehyde resin.

Further, examples of the processes for preparing microcapsules include an in situ process utilizing polymerization of monomers (Japanese Patent Publication No. 36(1961)-9168 and Japanese Patent Provisional Publication No. 51(1976)-9079); a polymerization dispersing and cooling process (U.K. Patents No. 927,807 and No. 965,074); and a spray-drying process (U.S. Pat. No. 3,111,407 and U.K. Patent No. 930,422).

A process for encapsulating oily droplets of the polymerizable compound is not limited to the above-mentioned ones, but a process of emulsifying core materials and then forming a polymeric membrane as a microcapsule shell over the core material is particularly preferred. Examples of the shell material include a polyamide resin and/or a polyester resin, a polyurea resin and/or a polyurethane resin, gelatin, an epoxy resin, a complex resin containing a polyamide resin and a polyurea resin, a complex resin containing a polyurethane resin and a polyester resin. A melamine-formaldehyde resin, of which fine microcapsules can be made, is particularly preferred in the invention.

The microcapsule having a polymer shell of a polymeric compound around a film composed of a reaction product of a water-soluble polymer having a sulfinyl group and a polymerizable compound having an ethylenic unsaturated group is preferred.

In the case that aminoaldehyde resins are used for microcapsules, the amount of residual aldehyde is preferably regulated to be below a certain value.

A mean grain size of microcapsules is preferably within the range of 3 to 20 μm. It is preferred that the grain sizes of microcapsules be homogeneously dispersed in the range above a certain value. The ratio between the thickness and the grain size of a microcapsule is preferably within a certain range.

In the case that a silver halide is contained in microcapsules, the above-described mean grain size of the silver halide is preferably not more than one fifth of the mean grain size of microcapsules, and more preferably it is not more than one tenth. A homogeneous and smooth image can be obtained by regulating the mean grain size of the silver halide not to be more than one fifth of the mean grain size of microcapsules.

In the case that a silver halide is contained in microcapsules, the silver halide is preferably contained within the shell of the microcapsule.

In preparation of the microcapsules, a base precursor can be directly dispersed in a polymerizable compound. However, it is particularly preferred that a base precursor is dispersed in water, and the dispersion is then emulsified in a polymerizable compound. In this case, a nonionic or amphoteric water soluble polymer is preferably dissolved in water in which the base precursor is dispersed.

Examples of the nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate co-acrylamide, hydroxyethyl cellulose, hydroxypropyl cellulose and methylcellulose. An example of the amphoteric water soluble polymer is gelatin.

The water soluble polymer is preferably used in an amount of 0.1 to 100 weight % based on the amount of the base precursor, and more preferably 1 to 50 weight %. The base precursor is preferably contained in the dispersion in an amount of 5 to 60 weight %, and more preferably of 10 to 50 weight %. The base precursor is preferably used in an amount of 2 to 50 weight % based on the amount of the polymerizable compound, and more preferably 5 to 30 weight %.

When a shell of a microcapsule is formed by dispersing an oily liquid containing a base precursor to an aqueous medium in the process for preparing the light-sensitive microcapsules, a nonionic or anionic water soluble polymer is preferably contained in the aqueous medium. The amount of oily liquid is preferably within the range of 10 to 120 weight. %, more preferably 20 to 90 weight. %, based on the amount of the aqueous medium.

Examples of the nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methylcellulose. Examples of the anionic water soluble polymer include polystyrenesulfinic acid, a salt of a copolymer of styrenesulfinic acid, a salt of polystyrenesulfonic acid, a copolymer of styrenesulfonic acid, a salt of polyvinyl sulfate, a salt of polyvinylsulfonic acid, a copolymer of maleic anhydride and styrene, and a copolymer of maleic anhydride and isobutylene.

The aqueous medium preferably contains the anionic water soluble polymer in an amount of 0.01 to 5 weight %, and more preferably 0.1 to 2 weight %. It is particularly preferred to use a water soluble polymer having a few sulfinic groups together with a nonionic water soluble polymer.

A hydrophilic compound is preferably dissolved in a polymerizable compound to reduce the solubility of the base precursor in the polymerizable compound. Examples of the hydrophilic group of the compound include —OH, —SO$_2$NH$_2$, —CONH$_2$ and —NHCONH$_2$. Examples of the hydrophilic compound include polyethylene glycol, polypropylene glycol, benzoic amide, cyclohexylurea, octyl alcohol, dodecyl alcohol, stearyl alcohol and stearamide.

Optionally employable components contained in a light-sensitive layer and optional layers included in a light-sensitive material are described below.

The binder employable for the light-sensitive material can be included in the light-sensitive layer singly or in combination. A water-soluble binder is preferably employed. A typical water-soluble binder is transparent or semi-transparent one, of which examples include natural substances such as gelatin, gelatine derivatives, cellulose derivatives, starch and gum arabic; and synthetic polymer substances such as polyvinyl alcohol, polyvinyl pyrrolidone and water-soluble polyvinyl compound (e.g., acrylamide polymer). One of the other examples of synthetic polymer substances is a dispersing vinyl compound which increases the size-stability of photographic materials in form of latex.

An organometalic salt can be used as an oxidizing agent in combination with silver halide in the invention. An organic silver salt is most preferably employed.

Examples of an organic compound employable for forming such organosilver salt oxidizing agent include benzotriazoles, aliphatic acids and other compounds described in U.S. Pat. No. 4,500,626 (columns 52–53). Also effectively employable are silver salts of carboxylic acids having alkynyl group (e.g., silver phenylpropionate) and acetylene silver salt. The organic silver salts can be used singly or in combination of two or more kinds.

The above-mentioned organic silver salt can be used in combination with a light-sensitive silver halide in an amount of 0.01 to 10 mole, preferably 0.01 to 1 mole, per 1 mole of the silver halide. The total amount of the organic silver salt and the silver halide is generally within a range of 1 mg/m$^2$–10 g/m$^2$ in terms of the amount of silver metal.

The antismudging agent employable for the light-sensitive material is preferably used in form of solid grains at room temperature. Concrete examples of the antismudging agent employable for the light-sensitive material include starch grains described in U.K. Patent No. 1,232,347, fine powder of polymer U.S. Pat. No. 3,625,736, microcapsules containing no color developing agent described in U.K. Patent No. 1,235,991, fine powder of cellulose described in U.S. Pat. No. 2,711,357 and inorganic grains such as talc, kaolin, bentonite, pagodite, zinc oxide, titanium oxide, alumina. A mean grain size of the above-mentioned grains is preferably within the range of 3 to 50 μm, more preferably 5 to 40 μm, in terms of volume mean diameter. It is effective that the size of the grain is larger than that of the microcapsule.

Various image formation accelerators is employable for the light-sensitive material.

Image formation accelerators have the functions such as 1) accelerating the transfer of a base or a base precursor, 2) accelerating the reaction of a reducing agent and a silver salt, 3) accelerating the passivating reaction of coloring substances by polymerization. From a viewpoint of physical chemistry concerning the functions, the image formation accelerators can be classified into base or base precursor nucleophilic compounds, oils, heat solvents, surface active agents, compounds having interactions with silver or silver salts, compounds having deoxidization function and other compounds. However, these substances generally have complex functions, so each of them usually has some acceleration effects described above.

In the system wherein the polymerizable compound is polymerized within the area where a latent image of silver halide is not formed, a thermal polymerization initiator or a photopolymerization initiator may be contained in the light-sensitive layer. Further, the thermal polymerization initiator or the photopolymerization initiator may also be contained in the image-receiving material to harden the transferred image.

Examples of the thermal polymerization initiator include azo compounds, organic peroxides, inorganic peroxides and sulfinic acids. The thermal polymerization initiator is described in "Addition Polymerization and Ring Opening Polymerization", pp.6–18, edited by the Editorial Committee of High Polymer Experimental Study of the High Polymer Institute, published by Kyoritsu Shuppan (1983).

Examples of the photopolymerization initiator include benzophenones, acetophenones, benzoins and thioxanthones. The photopolymerization initiator is described in "Ultraviolet Ray Hardening System", pp.63–147, edited by the General Technical Center (1989).

Various surface active agents are employable for the light-sensitive material for various purpose, such as aiding the coating process, increasing facility of peeling off, increasing slipperiness, preventing electrification and accelerating development.

An antistatic agent is employable for the light-sensitive materials in order to prevent electrifying. Antistatic agents are described in Research Disclosure Vol. 176, No. 17643, pp. 27 (November 1978).

In order to prevent halation and irradiation, a dye or a pigment may be added to the light-sensitive layer of the light-sensitive materials.

The microcapsules may contain a coloring matter having a property of being decolored by heating or irradiation with light. The coloring matter having a property of being decolored by heating or irradiation with light can play the role corresponding to yellow filter in the conventional silver salt photography system.

In the case that a solvent of a polymerizable compound is used for the light-sensitive material, the solvent is preferably contained in microcapsules other than those containing polymerizable compound. Silver halide grains adsorbing water soluble vinyl polymer can be also employed.

Various development terminators can be employable for the light-sensitive materials in order to obtain an image of constant quality independent of the temperature and the process of development treatment.

In the specification, "a development terminator" means a compound which interacts with silver or silver salts to inhibit the development, or a compound which neutralizes or reacts with a base to reduce the base concentration in order to terminate the development. Concrete examples of a development terminator include a acid precursor which emits an acid by heating, an electrophilic compound which substitutes a chlorine atom existing together with by heating, a nitrogen-including heterocyclic compound, a mercapto compound and a precursor thereof.

In the case that gelatin is employed as a binder of the light-sensitive material, various hardening agents are employable. Concrete examples include aldehyde type hardening agents, aziridine type hardening agents, epoxy type hardening agents, vinylsulfonate type hardening agents, N-methylole type hardening agents and polymer type hardening agents.

Other optional components are described in Research Disclosure Vol. 170, No. 17029, pp. 9-15 (June, 1978).

Examples of an optional layer provided in a light-sensitive material include an image-receiving layer, a heating layer, an anti-electrifying layer, an anti-curling layer, a peeling layer, a cover sheet or a protective layer, a layer containing a base or a base precursor, a layer of base barrier and an anti-halation layer (a coloring layer).

When the light-sensitive material is used, the image may be formed on the above-mentioned image-receiving layer provided on the light-sensitive material, instead of using an image-receiving material (described later). An image-receiving layer provided on the light-sensitive material can have the same constitution as that on an image-receiving material. The detail of the image-receiving layer is described below.

The value of pH in the light-sensitive layer of the invention is preferably not more than 7. The value of pH in the light-sensitive layer preferably is not elevated by heating.

Using the light-sensitive material of the invention, and image can be formed on an image-receiving material. The image-receiving material is described below.

As a support of an image-receiving material, not only the above-described support of a light-sensitive material but also baryta paper can be employed. In the case that a porous material such as paper is used as a support of an image-receiving material, the surface of the material preferably has a certain smoothness.

A image-receiving material generally comprises a support and an image-receiving layer provided thereon. The image-receiving layer can be desirably constituted with various compounds, depending upon color developing system of the above-mentioned color image forming substances and other conditions. In the present invention, a dye or pigment is used as an color image forming substances. Therefore, the image-receiving material may comprise a support alone.

The image-receiving layer can comprise at least one layer including a mordanting agent. The mordanting agent can be selected from the compounds known in the field of photographic technology. If necessary, an image-receiving layer may comprise two or more layers using plural mordanting agents of which mordantabilities are different each other.

An image-receiving layer of an image-receiving material comprises a white pigment, a binder and other additives. A white pigment itself or space among the white pigment grains accepts a polymerizable compound.

Examples of the white pigment employable for an image-receiving layer include inorganic white pigments such as oxides (e.g., silicon oxide, titanium oxide, zinc oxide, magnesium oxide and aluminium oxide), salts of alkaline earth metals (magnesium sulfate, barium sulfate, calcium sulfate, magnesium carbonate, barium carbonate, calcium carbonate, calcium silicate, magnesium hydroxide, magnesium phosphate and magnesium hydrogenphosphate), aluminium silicate, aluminum hydroxide, zinc sulfide, various kinds of clay, talc, kaolin, zeolite, acid clay, soluble clay and glass; organic white pigments such as polyethylene, polystyrene, benzoguanamine resin, urea-formalin resin, melamine-formalin resin and polyamide resin. The white pigment above-described can be used in the invention singly or in combination. A white pigment which can absorb a high amount of a polymerizable compound is preferably used.

A mean grain size of the white pigment is within a range of 0.1 to 20 $\mu$m, preferably 0.1 to 10 $\mu$m. The amount of the pigment is in the range of 0.1 to 60 g, preferably 0.5 to 30 g. The weight ratio of the white pigment to a binder preferably is in the range of 0.01 to 0.4, and more preferably 0.03 to 0.3.

As the binder, a water-soluble polymer, a polymer latex and a polymer soluble in an organic solvent are employed.

Examples of the water-soluble polymer include cellulose derivatives such as carboxymethylcellulose, hydroxyethylcellulose and methylcellulose; proteins such as gelatin, phthalated gelatin, casein and egg albumin; starch and its derivatives such as dextrin and etherificated starch; synthetic polymers such as polyvinyl alcohol, partial acetal of polyvinyl alcohol, poly-N-vinyl pyrolidone, polyacrylic acid, polymethacrylic acid, polyacrylamide, polyvinyl imidazole, polyvinyl pirazole and polystyrenesulfonic acid; and others such as locust bean gum, pullulan, gum arabic and sodium alginate.

Examples of the polymer latex include styrene-butadiene copolymer latex, methyl methacrylate-butadiene copolymer latex, polyacrylate latex, polymethacrylate latex, acrylate-methacrylate copolymer latex and ethylene-vinyl acetate copolymer latex.

Examples of the polymer soluble in an organic solvent include polyester resin, polyurethane resin, polyvinyl chloride resin and polyacrylonitrile resin.

The binders can be used singly or in combination. A combination of two or more binders can be employed to cause a phase separation in the image recording layer.

The image-receiving layer may further contain various components other than the white pigment and the binder.

For example, a color developer can be contained in the image-receiving layer in the case that a color formation system using a color former and the color developer is used. Examples of the color developer include phenols, organic acids and salts, and esters. Zinc salt of an salicylic acid derivative is preferred in the case that a leuco dye is used as a color image forming substance (color former). 3,5-di-α-methylbenzylsalicylic acid is particularly preferred.

The color developer is preferably contained in the image-receiving layer in a coating amount of 0.1 to 50 g/m², and more preferably 0.5 to 20 g/m².

A thermoplastic compound may be contained in the image recording layer. In the case that the thermoplastic compound is contained in the image recording layer, the image recording layer itself is preferably composed of an agglomerate of fine particles of the thermoplastic compound (i.e., granular thermoplastic compound). The image recording layer having this constitute has such advantages that the formation of a transferred image can be readily done and a glossy image can be obtained under heating after the image formation. There is no specific limitation on the thermoplastic compounds, and any known thermoplastic resins (plastics) and waxes can be employed. The glass transition point of the thermoplastic resin or the melting point of the wax preferably is not higher than 200° C.

A photopolymerization initiator or a thermal polymerization initiator may be contained in the image recording layer. The photopolymerization initiator or the thermal polymerization initiator can be incorporated into the image recording layer to cure the unpolymerized polymerizable compound.

The present invention is further described by the following examples, but those examples are given by no means to restrict the invention.

EXAMPLE 1

Preparation of silver halide emulsion (ER-1)

In 1,600 ml of water were dissolved 25 g of gelatin and 1.2 g of sodium chloride, and the resulting gelatin solution was adjusted to pH 3.5 using 1N-sulfuric acid and was kept at 45° C. To the gelatin solution, 200 ml of an aqueous solution containing 65 g of potassium bromide and 200 ml of an aqueous solution containing 100 g of silver nitrate were added simultaneously at the same feed rate over 30 minutes. After 5 minutes, to the resulting mixture was added 500 mg of the sensitizing dye (SR-1), and after 15 minutes, to the resulting mixture were further added 100 ml of an aqueous solution containing 2.5 g of potassium iodide and 100 ml of an aqueous solution containing 2.0 g of silver nitrate at the same feed rate over 5 minutes. To the resulting emulsion was then added an aqueous solution of polyisobutylene/monosodium maleate copolymer. After the emulsion was washed with water for desalting, 4.0 g of gelatin was added to the emulsion. Then, to the emulsion was further added 0.45 mg of sodium thiosulfate to chemically sensitize the emulsion at 55° C. for 20 minutes. Thus, a monodispersed tetradecahedral silver iodobromide emulsion (ER-1) (yield: 400 g, mean grain size: 0.18 μm distribution coefficient: 26%) was prepared.

Sensitizing dye (SR-1)

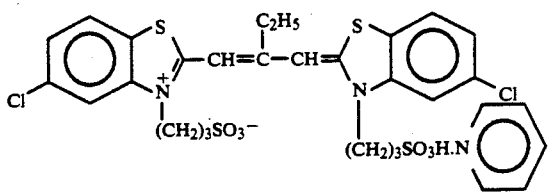

Preparation of solid dispersion (KB-1)

To a 300 ml dispersion container were added 160 g of 3% aqueous solution of gelatin, 40 g of the base precursor (BG-1) and 200 ml of glass beads of which diameters were within a range of 0.5–0.75 mm. The resulting mixture was stirred at 3,000 r.p.m. for 30 minutes using a Dynomill to obtain a solid dispersion (KB-1) of the base precursor (43) of which grain size was not more than 1.0 μm.

Base precursor (BG-1)

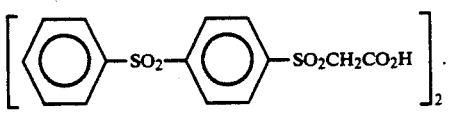

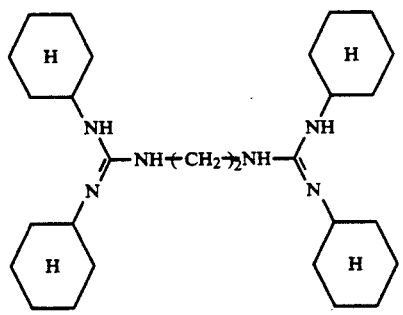

Preparation of pigment dispersion (GC-1)

In 170 g of the polymerizable compound (MN-1) were dissolved 3.0 g of Solsperse 17000 (tradename of ICI) and 2.0 g of Solsperse 5000 (tradename of ICI). To the solution, 30 g of copper phthalocyanine (available from Tokyo Chemical Industry Co., Ltd.) was added. The mixture was stirred at 5,000 r.p.m. using Eiger Motor Mill (tradename of Eiger Enginierring) for 1 hour to obtain a pigment dispersion (GC-1).

(MN-1)

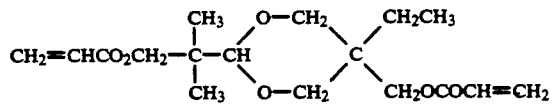

Preparation of light-sensitive composition (PR-1)

To 45 g of the pigment dispersion (GC-1), 9 g of 20 weight % solution of the following copolymer (1P-1) in the following solvent (SV-1). To the resulting solution, 2.3 g of (RD-1), 6.2 g of (RD-2), 1.0 g of 0.5% methanol solution of the following mercapto compound (FF-3)

and 5 g of stearyl alcohol were added to prepare an oily solution.

To the resulting solution, 3.8 g of the silver halide emulsion (ER-1) and 24 g of the solid dispersion (KB-1) were added, and the resulting mixture was stirred at 15,000 r.p.m. for 5 minutes at 50° C. using a homogenizer to obtain a light-sensitive composition (PR-1) in the form of a W/O emulsion.

Copolymer (1P-1)

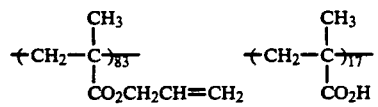

(SV-1)

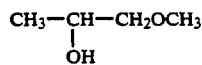

(RD-1)

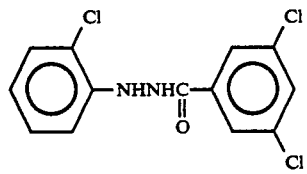

(RD-2)

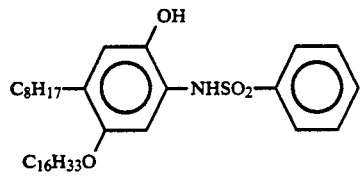

(FF-3)

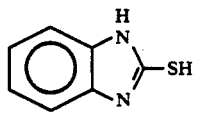

Preparation of microcapsule dispersion (CR-1)

To 4.0 g of 15% aqueous solution of the following polymer (2P-1) were added 26 g of distilled water and 70 g of 10% aqueous solution of the following polymer (2P-2). The resulting mixture was adjusted to pH 5.0. The light-sensitive composition (PR-1) was added to the mixture and the resulting mixture was stirred at 5,000 r.p.m. for 20 minutes at 50° C. using a dissolver to obtain a W/O/W emulsion.

Independently, to 14.8 g of melamine were added 20.0 g of 37% aqueous solution of formaldehyde and 76.3 g of distilled water, and the resulting mixture was stirred at 60° C. for 40 minutes to obtain a transparent melamine formaldehyde precondensate.

To 146 g of the above-prepared W/O/W emulsion were added 7.5 g of distilled water and 37.5 g of the precondensate. The resulting mixture was adjusted to pH 5.0 using 2N sulfuric acid at 25° C. The mixture was then heated to 60° C. for 30 minutes and stirred at 60° C. for 30 minutes. Further, to the mixture was added 10.3 g of 40% aqueous solution of urea, and the mixture was adjusted to pH 3.5 using 10% aqueous solution of 2N sulfuric acid, and then stirred at 60° C. for 40 minutes. The mixture was cooled to room temperature, and adjusted to pH 6.5 using 2N aqueous solution of sodium hydroxide. Thus, a red sensitive microcapsule dispersion (CR-1) containing microcapsules having a melamine-formaldehyde resin shell was prepared.

Polymer (2P-1)

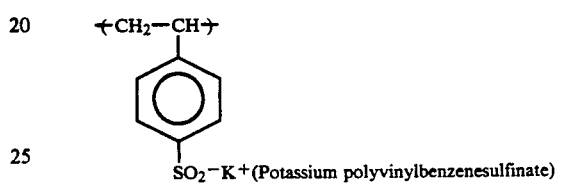

Polymer (2P-2)

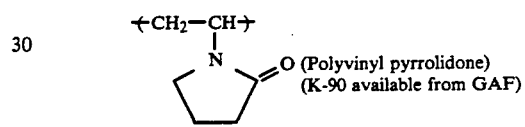

Preparation of silver halide emulsion (EG-1)

In 1,600 ml of water were dissolved 25 g of gelatin and 0.5 g of sodium chloride, and the resulting gelatin solution was adjusted to pH 3.2 using 1N-sulfuric acid and was kept at 45° C. To the gelatin solution, 200 ml of an aqueous solution containing 71 g of potassium bromide and 200 ml of an aqueous solution containing 100 g of silver nitrate were added simultaneously at the same feed rate over 30 minutes. After 1 minute, to the resulting mixture was added 480 mg of the sensitizing dye (SG-1), and after 10 minutes, to the resulting mixture were further added 100 ml of an aqueous solution containing 2.9 g of potassium iodide and 100 ml of an aqueous solution containing 3 g of silver nitrate at the same feed rate over 5 minutes. To the resulting emulsion was then added an aqueous solution of polyisobutylene/monosodium maleate copolymer. After the emulsion was washed with water for desalting, 4.5 g of gelatin was added to the emulsion. Then, to the emulsion was further added 0.7 mg of sodium thiosulfate to chemically sensitize the emulsion at 60° C. for 15 minutes. Thus, a monodispersed tetradecahedral silver iodobromide emulsion (EG-1) (yield: 420 g, mean grain size: 0.15 μm distribution coefficient: 24%) was prepared.

Sensitizing dye (SG-1)

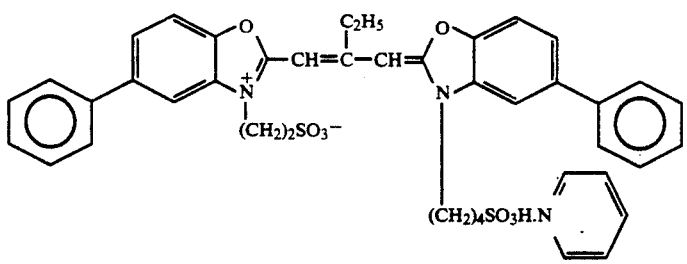

Preparation of pigment dispersion (GM-1)

To 255 g of the polymerizable compound (MN-2) was added 45 g of Microlith Red 3RA (tradename, available from Ciba-Geigy). The resulting mixture was stirred at 90° C. for 90 minutes at 5,000 r.p.m. using Eiger motor mill (produced by Eiger Engineering Co., Ltd.), to prepare a dispersion (GM-1).

Polymerizable compound (MN-2)

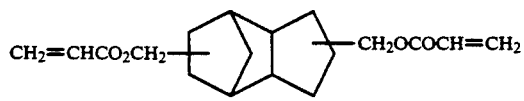

Preparation of light-sensitive composition (PG-1)

To 45 g of the pigment dispersion (GM-1) were dissolved 9 g of 20% solution of the copolymer (1P-1) in (SV-1), 2.3 g of (RD-1), 3.1 g of (RD-2), 1.0 g of 0.5% methanol solution of (FF-3) and 5.0 g of stearyl alcohol.

To the resulting oily solution, 3.8 g of the silver halide emulsion (EG-1) and 24 g of the solid dispersion (KB-1) were added, and the resulting mixture was stirred at 15,000 r.p.m. for 5 minutes at 60° C. using a homogenizer to obtain a light-sensitive composition (PG-1) in the form of a W/O emulsion.

Preparation of microcapsule dispersion (CG-1)

A green sensitive microcapsule dispersion (CG-1) was prepared in the same manner as in preparation of the red sensitive microcapsule dispersion (CR-1) except that the light-sensitive composition (PG-1) was used in place of (PR-1) and the mixture of the light-sensitive composition was stirred at 5,000 r.p.m. for 20 minutes at 60° C. to obtain a W/O/W emulsion.

Preparation of silver halide emulsion (EB-1)

In 1,500 ml of water were dissolved 20 g of gelatin and 0.5 g of sodium chloride, and the resulting gelatin solution was adjusted to pH 3.2 using 1N-sulfuric acid and was kept at 42° C. To the gelatin solution, 300 ml of an aqueous solution containing 66 g of potassium bromide and 300 ml of an aqueous solution containing 100 g of silver nitrate were added simultaneously at the same feed rate over 50 minutes. After 5 minutes, to the resulting mixture was added 430 mg of the sensitizing dye (SB-1), and after 15 minutes, to the resulting mixture were further added 100 ml of an aqueous solution containing 2.9 g of potassium iodide and 100 ml of an aqueous solution containing 3 g of silver nitrate at the same feed rate over 5 minutes. To the resulting emulsion was then added an aqueous solution of polyisobutylene/monosodium maleate copolymer. After the emulsion was washed with water for desalting, 4 g of gelatin was added to the emulsion. Then, to the emulsion was further added 0.5 mg of sodium thiosulfate to chemically sensitize the emulsion at 50° C. for 15 minutes. Thus, a monodispersed tetradecahedral silver iodobromide emulsion (EB-1) (yield: 460 g, mean grain size: 0.24 μm distribution coefficient: 26%) was prepared.

Sensitizing dye (SB-1)

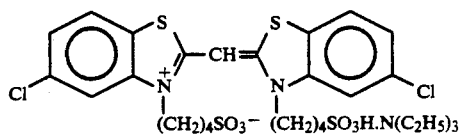

Preparation of pigment dispersion (GY-1)

To 255 g of the polymerizable compound (MN-2) was added 45 g of Microlith Yellow 4GA (tradename, available from Ciba-Geigy). The resulting mixture was stirred at 80° C. for 90 minutes to obtain a pigment dispersion (GY-1).

Preparation of light-sensitive composition (PB-1)

To 45 g of the pigment dispersion (GY-1) were dissolved 9 g of 20 wt. % solution of copolymer (1P-1) in (SV-1), 2.3 g of (RD-1), 6.2 g of (RD-2), 1.0 g of 0.5% methanol solution of (FF-3) and 5.0 g of stearyl alcohol.

To the resulting oily solution, 3.8 g of the silver halide emulsion (EB-1) and 24 g of the solid dispersion (KB-1) were added, and the resulting mixture was stirred at 15,000 r.p.m. for 5 minutes at 60° C. using a homogenizer to obtain a light-sensitive composition (PB-1) in the form of a W/O emulsion.

Preparation of microcapsule dispersion (CB-1)

A blue sensitive microcapsule dispersion (CG-1) was prepared in the same manner as in preparation of the red sensitive microcapsule dispersion (CR-1) except that the light-sensitive composition (PG-1) was used in place of (PR-1) and the mixture of the light-sensitive composition was stirred at 7,000 r.p.m. for 20 minutes at 60° C. to obtain a W/O/W emulsion.

Preparation of light-sensitive material (A)

To a mixture of 53 g of the light-sensitive microcapsule dispersion (CR-1), 53 g of the light-sensitive microcapsule dispersion (CG-1) and 53 g of the light-sensitive microcapsule dispersion (CB-1) were added 1.0 g of the following surface active agent (WW-1), 5 g of 5% aqueous solution of the following surface active agent (WW-2), 0.4 g of 30% solution of Surflon S111 (tradename of Asahi Glass Co., Ltd.) and 25 g of 20% aqueous solution of polyvinyl alcohol (tradename: PVA-205, available from Kurare Co., Ltd.). The resulting mixture was stirred at 40° C. for 30 minutes to prepare a coating solution.

The coating solution was coated over aluminum vacuum evaporated onto a polyethylene terephthalate film (thickness: 25 μm) in an amount of 68 ml/m², and the coated layer of the solution was dried at 60° C. to prepare a light-sensitive material (A).

Surface active agent (WW-1)

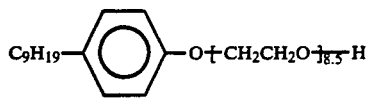

Surface active agent (WW-2)

$$\underset{Na_3S-CHCO_2C_8H_{17}}{CH_2CO_2C_8H_{17}}$$

Preparation of image-receiving material

A mixture of 80 g of calcium carbonate (tradename: PC700, available from Shiraishi Industrial Co., Ltd.), 1.6 g of a surface active agent (poize 520, available from Kao Co., Ltd.) and 221.4 ml of water was stirred at 2,000 r.p.m. for 20 minutes using polytoron dispersing device (tradename: PT 10/35, available from Kinematica Co., Ltd.). To 52 g of the resulting dispersion were added 34.5 g of 10% aqueous solution of polyvinyl alcohol (tradename: PVA-205, available from Kurare Co., Ltd.) and 4 g of 10% aqueous solution of the surface active agent (WW-1) to prepare a coating solution for an image-receiving layer.

The coating solution was uniformly coated over a paper having a basis weight of 80 g/m² (i.e., a paper having a fiber length distribution [defined by JIS-P-8207] in which the sum of weight percent of 24 mesh residue and 42 mesh residue is within a range of 30–60%, as described in Japanese Patent Provisional Publication No. 63(1988)-186239) in an amount of 50 ml/m², and the coated layer of the solution was dried at 60° C. to prepare an image-receiving material.

Image formation and evaluation thereof

The light-sensitive material (A) was exposed to light at 5,000 lux and color temperature of 4800° K. for 4 seconds using a tungsten lamp through a filter in which the transmission density is changed from 0 to 3.0, and then heated on a hot plate from the side of the support at 140° C., 150° C. or 160° C. for 1 second, 2 seconds, 5 seconds or 10 seconds.

Thereafter, the light-sensitive material was superposed on the image-receiving material in such a manner that the light-sensitive layer faced the image-receiving layer, and they were passed through a pressure roller having a pressure of 1,000 kg/cm². The visual minimum and maximum densities of the image formed on the image-receiving material were measured using X-light.

Further, an image was formed and evaluated in the same manner as is described above, except that the light-sensitive material was heated on a hot plate from the side of the light-sensitive layer.

The results are set forth in Table 1.

TABLE 1

| Heating Tempera- ture | Heated from Side of | Heating Time (Minimum Density/ Maximum Density) | | | |
|---|---|---|---|---|---|
| | | 1 | 2 | 5 | 10 |
| 140° C. | Support | — | 0.64 /1.23 | 0.30 /1.23 | 0.17 /0.98 |
| | Layer | — | — | 0.87 /1.22 | 0.13 /1.18 |
| 150° C. | Support | 0.40 /1.20 | 0.14 /1.21 | 0.13 /1.18 | 0.14 /0.91 |
| | Layer | — | 1.19 /1.24 | 0.67 /1.01 | 0.11 /0.76 |
| 160° C. | Support | 0.19 /1.20 | 0.11 /1.18 | 0.10 /0.87 | — |
| | Layer | — | 1.02 /1.21 | 0.51 /0.89 | 0.14 /0.34 |

It is apparent from the results shown in Table 1 that a clear image having a high contrast is quickly formed in the case that the light-sensitive material is heated from the side of the support according to the present invention. On the other hand, a relatively long heating time is required for forming a clear image in the case that the light-sensitive material is heated from the side of the light-sensitive layer.

EXAMPLE 2

Preparation of light-sensitive materials (B), (C) and (D)

Light-sensitive materials (B), (C) and (D) was prepared in the same manner as in preparation of the light-sensitive material (A) except that the thickness of the support is changed from 25 μm to 50 μm, 75 μm or 100 μm.

Image formation and evaluation thereof

An image was formed and evaluated in the same manner as in Example 1, except that the light-sensitive material was heated on a hot plate from the side of the support at 150° C. or 160° C. for 1 second, 2 seconds or 5 seconds.

The results are set forth in Table 2.

TABLE 2

| Light- sensitive Material | Thickness of Support | Heating Temper- ature | Heating Time (Minimum/Maximum Density) | | |
|---|---|---|---|---|---|
| | | | 1 | 2 | 5 |
| (A) | 25 μm | 150° C. | — | 0.14 /1.21 | 0.13 /1.18 |
| | | 160° C. | 0.19 /1.20 | 0.11 /1.18 | — |
| (B) | 50 μm | 150° C. | — | 0.21 /1.22 | 0.15 /1.19 |
| | | 160° C. | 0.24 /1.21 | 0.16 /1.07 | — |
| (C) | 75 μm | 150° C. | — | 0.45 /1.20 | 0.38 /1.21 |
| | | 160° C. | 0.56 /1.22 | 0.39 /1.20 | — |
| (D) | 100 μm | 150° C. | — | 0.67 /1.23 | 0.44 /1.20 |
| | | 160° C. | 0.82 /1.23 | 0.46 /1.22 | — |

It is apparent from the results shown in Table 2 that the thickness of the support should be not more than 75 μm (preferably not more than 50 μm) in the case that the light-sensitive material is heated from the side of the support according to the present invention. Additionally, a thick support (having a thickness of more than 75 μm) is expansive and intractable.

EXAMPLE 3

The light-sensitive material (A) was split into peaces of 22 cm wide, and 50 m of the peace was wound up around a feeding roll wherein the light-sensitive layer faces the outside. The roll of the light-sensitive layer was attached to the image recording apparatus shown in FIG. 1.

As is shown in FIG. 1, the light-sensitive material 9 is carried from the feeding roll 1 at a speed of 2 cm one second, scanned by the exposure device 2 (the side of the light-sensitive layer 11 is exposed to light), heated at 155° C. by the heating device 3 (length: 3 cm, heating time: 1.5 second), pressed on the image-receiving material 10 (fed from the image-receiving material tray 8) by the pressing device 4, separated from the image-receiving material by the separating device 6, and wound up around a receiving roll 5. The image-receiving material is received in the receiving tray 8. The maximum density of the image formed on the image receiving material was 1.20, and the minimum density was 0.21.

According to the image forming method of the present invention, a clear image is formed in a short development time. Accordingly, the size of the heating device is small. Therefore, a very compact image recording apparatus shown in FIG. 1 can be constructed.

EXAMPLE 4

Preparation of support

A polyethylene terephthalate sheet was extruded from a machine in a conventional manner, stretched in the machine direction and in the corss direction, and thermally set at various temperatures from 200° C. to 270° C. to prepare a polyethylene terephthalate film. An aluminum film was evaporated onto the polymer film. The stretching ratio of the prepared films and commercially available films was evaluated according to JIS-C-2318.

Five pieces of sample (width: 20 mm, length: about 150 mm) were cut from the film in the machine direction and other five pieces were cut from the film in the cross direction. The samples were marked at the distance of about 100 mm along the center of the samples. The samples were suspended in a thermostat at 150° C.±3° C. for 2 hours, and left at room temperature for 30 minutes. The distance between the marks were measured, the stretching ratio was determined according to the following formula, and the average value was calculated.

$$\text{Thermal Stretching Ratio} = \frac{L2 - L1}{L1} \times 100$$

wherein:
L1: Distance between the marks before heating
L2: Distance between the marks after heating The stretching ratio of the prepared films and commercially available films was evaluated according to JIS-C-2318.

The above-defined temperature is the highest temperature of the heat development process in the range of 120° C. to 180° C. In this experiment, the above-defined temperature and the highest temperature of the heat development process is 150° C.

Using various supports, light-sensitive materials were prepared and evaluated in the following manner.

Preparation of light-sensitive material

To a mixture of 16.7 g of the light-sensitive microcapsule dispersion (CR-1), 16.7 g of the light-sensitive microcapsule dispersion (CG-1) and 16.7 g of the light-sensitive microcapsule dispersion (CB-1) were added 7.1 g of 5 aqueous solution of the surface active agent (WW-1), 8.8 g of 1% aqueous solution of the surface active agent (WW-2) and 8.4 g of 20% aqueous solution of polyvinyl alcohol (tradename: PVA-205, available from Kurare Co., Ltd.) to prepare a coating solution.

The coating solution was coated over the above-prepared polyethylene terephthalate film support in an amount of 68 ml/m², and the coated layer of the solution was dried at 60° C. to prepare a light-sensitive material.

Preparation of image-receiving material

A mixture of 240 g of calcium carbonate (tradename: Callight SA, available from Shiraishi Central Laboratory), 5.6 g of a surface active agent (poize 520, available from Kao Co., Ltd.) and 354.4 g of water was stirred at 8,000 r.p.m. for 3 minutes using a dispersing device (tradename: Ultra Disperser LK-41, Yamato Science Co., Ltd.). To 52 g of the resulting dispersion were added 4 g of 1% aqueous solution of the surface active agent (WW-2) and 52 g of 10 aqueous solution of polyvinyl alcohol (tradename: PVA-117, available from Kurare Co., Ltd.), and water was added to the resulting mixture up to 130 g to prepare a coating solution for an image-receiving layer.

The coating solution was uniformly coated over a paper having a basis weight of 80 g/m² (i.e., a paper having a fiber length distribution [defined by JIS-P-8207] in which the sum of weight percent of 24 mesh residue and 42 mesh residue is within a range of 30–60%, as described in Japanese Patent Provisional Publication No. 63(1988)-186239) in an amount of 65 g/m², and the coated layer of the solution was dried at 60° C. to prepare an image-receiving material.

Image formation and evaluation thereof

The light-sensitive material was exposed to light at 2,000 lux and color temperature of 4800° K. for 4 seconds using a tungsten lamp through a step wedge, and then heated on a hot plate from the side of the support at 150° C. for 2 seconds. Thereafter, the light-sensitive material was superposed on the image-receiving material, and they were passed through a pressure roller having a pressure of 1,000 kg/cm². The light-sensitive material was then removed from the image receiving material.

The uniformity of the color in the obtained image was measured. The uniformity was determined by measuring the color at various points at the distance of 20 mm, 2 mm and 0.2 mm.

The results are set forth in Table 3. In the Table 3, "Aluminium Film" indicates whether an aluminium film is evaporated onto the polymer film (+) or not (−). Further, "Uniformity of Color" indicates whether a color spot is observed (B) or not (A).

TABLE 3

| Thermal Stretching Ratio | | Aluminium Film | Uniformity of Color |
|---|---|---|---|
| Machine Direction | Cross Direction | | |
| −3 | −0.5 | + | A |
| ±0 | −1 | + | A |

TABLE 3-continued

| Thermal Stretching Ratio | | Aluminium Film | Uniformity of Color |
| --- | --- | --- | --- |
| Machine Direction | Cross Direction | | |
| −0.5 | −0.8 | + | A |
| −0.6 | −0.7 | + | A |
| +0.6 | +0.6 | + | B (Large Spots) |
| +1 | −1 | + | B (Large Spots) |
| −5 | +1 | + | B (Large Spots) |
| −6 | +0.7 | + | B (Large Spots) |
| −3 | −0.5 | − | B (Small Spots) |
| ±0 | −1 | − | B (Small Spots) |
| −0.5 | −0.8 | − | B (Small Spots) |
| −0.6 | −0.7 | − | B (Small Spots) |

I claim:

1. An image forming method which comprises the steps of:

imagewise exposing a light-sensitive material which comprises a support and a light-sensitive layer provided thereon containing silver halide, a reducing agent, an ethylenically unsaturated polymerizable compound, a color image forming substance and a base precursor, wherein the silver halide, the reducing agent, the polymerizable compound, the color image forming substance and the base precursor are contained in microcapsules which are dispersed in the light-sensitive layer, and the support is made of a polymer film having a thickness of not more than 50 μm; and simultaneously or thereafter heating the light-sensitive material from the side of the support for 0.1 to 5 seconds.

2. The image forming method as claimed in claim 1, wherein the support is made of a polymer film having a thickness in the range of 10 μm to 50 μm.

3. The image forming method as claimed in claim 1, wherein the support is made of a polymer film onto which aluminum is vacuum evaporated.

4. The image forming method as claimed in claim 1, wherein the heating begins at least 0.1 second after completing the imagewise exposing.

5. The image forming method as claimed in claim 1, wherein the light-sensitive material is heated for 0.1 to 3 seconds.

6. The image forming method as claimed in claim 1, wherein the light-sensitive material is heated at a temperature of 60° C. to 250' C.

7. The image forming method as claimed in claim 1, wherein the light-sensitive material is heated on a hot plate from the side of the support.

8. The image forming method as claimed in claim 1, wherein the light-sensitive material is heated under conditions substantially not containing water.

9. The image forming method as claimed in claim 1, wherein after the light-sensitive material is heated, the light-sensitive material is pressed on an image receiving material.

10. The image forming method as claimed in claim 1, wherein the steps of the method are conducted in an image recording apparatus.

11. The image forming method as claimed in claim 1, wherein the light-sensitive material is in the form of roll film.

12. The image forming method as claimed in claim 1, wherein the light-sensitive material is heated while the side of the light-sensitive layer is open to the air.

13. The image forming method as claimed in claim 1, wherein the support has a stretching ratio in the range of −5% to +0.5% measured at 120° C. to 180° C. both in a lengthwise direction and in a widthwise direction.

* * * * *